(12) United States Patent
Boulkenafed et al.

(10) Patent No.: US 10,504,271 B2
(45) Date of Patent: Dec. 10, 2019

(54) METHOD, PROGRAM AND SYSTEM FOR SIMULATING A 3D SCENE WITH A SET OF COMPUTING RESOURCES RUNNING IN PARALLEL

(71) Applicant: DASSAULT SYSTEMES, Velizy Villacoublay (FR)

(72) Inventors: Malika Boulkenafed, Courbevoie (FR); Philippe Robert Felix Belmans, Paris (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 0 days.

(21) Appl. No.: 15/719,267

(22) Filed: Sep. 28, 2017

(65) Prior Publication Data
US 2018/0096514 A1 Apr. 5, 2018

(30) Foreign Application Priority Data
Sep. 30, 2016 (EP) ...................... 16306291

(51) Int. Cl.
*G06T 15/00* (2011.01)
*G06F 9/50* (2006.01)
(Continued)

(52) U.S. Cl.
CPC .......... *G06T 15/005* (2013.01); *G06F 9/5083* (2013.01); *G06F 17/50* (2013.01);
(Continued)

(58) Field of Classification Search
None
See application file for complete search history.

(56) References Cited

U.S. PATENT DOCUMENTS 8,108,661 B2 * 1/2012 Lee ...................... G06F 15/7842
712/16
8,250,578 B2 * 8/2012 Krishnamurthy ..... G06F 9/3877
710/3

(Continued)

OTHER PUBLICATIONS

Office Action dated Apr. 19, 2017, in Europe Patent Application No. 16306291.2-1879. (13 pages).

(Continued)

*Primary Examiner* — Said Broome
(74) *Attorney, Agent, or Firm* — Oblon, McClelland, Maier & Neustadt, L.L.P.

(57) ABSTRACT

The invention notably relates to a computer-implemented method for simulating a 3D scene. The simulation is carried out with a set of computing resources running in parallel. The method comprises partitioning a 3D scene into a plurality of zones. Each zone is sized to satisfy real-time computing constraint by one computing resource of the set. The method comprises assigning each zone of the plurality to a computing resource, computing an estimation of a load of each computing resource and determining whether one or more computing resources are over-loaded or under-loaded, computing, for each zone, a contribution of the zone to the load of the computing resource to which the zone is assigned, reassigning one or more zones of a computing resource that is over-loaded or under-loaded to another computing resource, the reassignment resulting from the computed contributions of the zones with a combinatorial optimization algorithm.

14 Claims, 4 Drawing Sheets

(51) Int. Cl.
*G06F 17/50* (2006.01)
*G06T 7/10* (2017.01)
*G06T 17/00* (2006.01)

(52) U.S. Cl.
CPC ............... *G06T 7/10* (2017.01); *G06T 17/00* (2013.01); *G06T 2200/04* (2013.01); *G06T 2200/16* (2013.01); *G06T 2210/52* (2013.01)

(56) References Cited

U.S. PATENT DOCUMENTS

| | | |
|---|---|---|
| 2005/0060590 A1 | 3/2005 | Bradley et al. |
| 2008/0104609 A1 | 5/2008 | D'Amora et al. |
| 2008/0165196 A1* | 7/2008 | Bakalash .................. G06F 3/14 345/505 |
| 2010/0113159 A1 | 5/2010 | Chapman et al. |
| 2011/0161957 A1 | 6/2011 | Bernardi et al. |

OTHER PUBLICATIONS

Kyungmin Lee, et al.; "A Scalable Dynamic Load Distribution Scheme for Multi-Server Distributed Virtual Environment Systems With Highly-Skewed User Distribution"; Proceedings of the 10$^{th}$ ACM Symposium on Virtual Reality Software and Technology, ACM Press, JP; Oct. 1-3, 2003; pp. 160-168; XP058112578; DOI: 10.1145/1008653.1008681; ISBN: 978-1-58113-569-5.

* cited by examiner

METHOD, PROGRAM AND SYSTEM FOR SIMULATING A 3D SCENE WITH A SET OF COMPUTING RESOURCES RUNNING IN PARALLEL

CROSS-REFERENCE TO RELATED APPLICATIONS

This application claims priority under 35 U.S.C. § 119 or 365 to European Application No. 16306291.2, filed Sep. 30, 2016. The entire contents of each of the above applications are incorporated herein by reference.

FIELD OF THE INVENTION

The invention relates to the field of computer programs and systems, and more specifically to a method, system and program for simulating a 3D scene with a set of computing resources running in parallel.

BACKGROUND 3D simulation has known a great success during the last three decades in various and large audiences of users: from engineers verifying how a system in design stage will behave in reality, to scientists exploring or demonstrating theoretical conceptions, to general public playing video games or enjoying 3D animation films. 3D simulation knows many evolutions over the past three decades and is still having a growing momentum. This is to answer audiences' needs for more complex and more realistic behaviors (Multi-Body Rigid Dynamics, Human Simulation, Cloth Simulation, Particle Simulation . . . ), for wider populations and typologies of objects and for wider scale.

3D simulation has to meet real-time requirements, which was more particularly initiated in the video game industry, by developing specific technologies to support a massive number of users interacting in large scale virtual worlds. A real-time response has to be offered at any time to the connected users, regardless of their number, and regardless of the induced computation costs for solving and rendering of the application.

Massively Multi-user On line applications (MMOs) allow a large number of users to simultaneously use an application such as real-world phenomena simulator, immersive applications, and so on. Similarly, Massively Multi-user On line Games (MMOG) allow a large number of garners to play simultaneous a video game. MMOs and MMOGs notably rely on computer networks, e.g. the Internet, for allowing the users or garners to connect to the applications or video games. Throughout this specification the word "application" and "video games" will be understood as to be synonymous, and the terms MMO and MMOG will be indifferently used.

MMOs involve complex and large virtual environments which are desired to be rendered in as much detail as possible, in as close to real time as possible, in order to provide users or game players with a more realistic experience. MMOs are specifically designed for the representation and the manipulation of 3D scenes, and are typically used on the end-user's computer for applications that require interactive, sequential, real-time 3D scene generation. As the user interacts with the 3D scene, the computer redraws the 3D representations rapidly enough to convey to the user the sense of a continuous, ongoing reality in which the user is participating. The scene is composed of many separate objects that can be manipulated by user when interacting with the 3D scene. Thus, MMOs involve large data volumes, high data rates and high data complexity is generally required in order to manage large numbers of users participating in real time in a spatially complex and highly detailed virtual environment.

MMOs are typically used for simulating real-world phenomena within computer models; for instance Multi-Body Rigid Dynamics, Human Simulation, Cloth Simulation, Particle Simulation. Simulations require accurate data and algorithms that describe real-world phenomena, such as the physical properties (strength, elasticity, etc.) of the materials used in a manufacturing process and the product to create a simulation of the process and a simulation of a product in use. 3D CAD/CAM (Computer Aided Design, Computer Aided Manufacturing) tools allow to create 3D representations of the product or component parts. MMO is also referred to as 3D experience, that is, a virtual environment in which engineers study the behaviours of objects; typically the simulated environment is an industry environment.

MMO's, just like MMOG's, must be scalable to dynamically adapt to the perpetually changing work-load, maintaining thus real-time performance. Scalability notably comprises the number of users that can simultaneously use the application, the number of computing resources for computing the simulations, the number of simultaneous interactions between objects of the 3D scene allowed by the application, and so on.

For MMOG's, the number of users may vary significantly, as well as the positional and graphical attributes of all contained dynamic objects. Nevertheless, the surrounding scenery is set once for all and the typology of dynamic objects and the supported behavior classes are predefined, before the game starts. Said otherwise, 3D scenes in MMOGs comprise a number of predetermined characteristics that strongly limit the needs of computing resources; thus improving scalability. Forecasting the needs of computing resources is thus possible.

On the contrary, for advanced MMOs, the scenery and population typology of the 3D scene can evolve and enrich, especially while application is running. Indeed, MMOs aim at simulating real-world phenomena, wherein the behavior of objects is dynamic and excludes predefined behavior classes. Consequently, 3D scenery in MMOs cannot use predefined characteristics as for MMOGs.

Thus, even if a 3D Experience has the same kind of real-time and massiveness constraints as MMOG, it has a specific and stringent requirement for far more sophisticated, realistic and accurate physical behaviors, therefore demanding computational power.

As one single solver cannot cope with all the solving computations in real-time, parallelization techniques are required. In few words, the 3D Experience is partitioned into so called parts or zones, each of them dealing with a specific spatial region of the 3D scene. As the computing cost of such parts varies over time—because their object populations evolve and because volumes of interactions within change as well-, it is necessary to dynamically dispatch all these parts among solvers to achieve optimal use of the CPU resources for granting real-time response. This need is commonly referred to as dynamic load balancing.

Considering technologies applicable to real-time, mostly those used in MMOG's, they are not suitable for the purpose of 3D Experience. MMOG's load balancing takes the liberty to alter the phenomenology of the scene: users can be transferred to another part, objects can be removed from high load part, interactions can be neutralized in high load parts, in a way it does not seem odd to the user. So, physics of the game is hacked to adjust to hardware limitations, therefore losing more realism. For the 3D Experience, physics is a definitively a constraint to satisfy, with a fixed degree of realism, and therefore cannot be taken as adjustment parameter.

Load balancing problem is also addressed in domains such as Finite Element Methods, which proposes a wide range of efficient solutions. But as real-time is out of the concern scope, all of these adjustment strategies are not grounded on tuning parameters explicitly related to computational time performance, but rather on ad-hoc tuning depending of the solving algorithms used, on the geometrical characteristics of the model (e.g. mesh) and on transient numerical properties (e.g. nonlinearities) with are specific to studied use-case.

Within this context, there is still a need for an improved method, computer program, and system achieving fair load balancing among an optimal number of solvers, running at their optimal capacity, avoiding overhead prone to corrupt real-time response of the simulation of the 3D scene.

SUMMARY OF THE INVENTION

It is therefore provided a computer-implemented method for simulating a 3D scene, the simulation being carried out with a set of computing resources running in parallel. The method comprises:
partitioning a 3D scene into a plurality of zones, each zone being sized to satisfy real-time computing constraint by one computing resource of the set;
assigning each zone of the plurality to a computing resource;
computing an estimation of a load of each computing resource and determining whether one or more computing resources are over-loaded or under-loaded;
computing, for each zone, a contribution of the zone to the load of the computing resource to which the zone is assigned;
reassigning one or more zones of a computing resource that is over-loaded or under-loaded to another computing resource, the reassignment resulting from the computed contributions of the zones with a combinatorial optimization algorithm.

The method may comprise one or more of the following:
the reassignment of one or more zones to another computing resource is carried out according to one or more of the following criterions: the number of computing resources is minimal; the number of zones reassigned to another computing resource is minimal; the one or more zones are reassigned to another computing resource that already performs computation for a zone that is neighbor of the reassigned one or more zones;
the reassignment of one or more zones to another computing resource is carried out such that a resulting load ($\lambda_i'$) of each computing resource verifies $\lambda_{min} \leq \lambda_i' \leq \lambda_{max}$ wherein $\lambda_{min}$ is the minimum load of a computing resource, $\lambda_{max}$ is the maximum load of a computing resource;
the estimation of the load ($\lambda_i$) of each computing resource is computed with the relation $\lambda_i$ (%)=100·$(T_{max}-T_i)/T_{max}$
wherein $\lambda_i$ (%) is a percentage of the estimated load $\lambda_i$, $T_{max}$ is the maximum time allocated to a computing resource for computing a time step of the simulation, $T_i$ is the elapsed time used by a computing resource for computing a time step of the simulation;
the contribution ($\pounds A_j$) of a zone is computed with the formula $\pounds A_j = \mu_i \cdot \lambda_i$ wherein $\mu_i$ is a weight factor with a value that belongs to a range [0; 1];
the weight factor $\mu_i$ is estimated from one or more selected among: a surface or a volume of a zone; a number of dynamic objects of a zone; an analytical model of the computer resource of load $\lambda_i$;
one or more zones of the plurality of zones is a 2D zone, wherein a 2D zone is 2D surface in the 3D scene;
one or more zones of the plurality of zones is a 3D zone, wherein a 3D zone is 3D volume of the 3D scene;
the steps of computing the estimation of the load ($\lambda_i$) and determining whether one or more computing resources are over-loaded or under-loaded are performed each P time step of the simulation, wherein P is a natural number;
the contribution ($\pounds A_j$) of a zone is computed after that one or more computing resources have been determined as over-loaded or under-loaded;
all the computing resources are identical.
reassigning one or more zones of a computing resource that is over-loaded or under-loaded to another computing resource further comprises: identifying, by the computing resource with a zone to be reassigned, objects of the 3D scene that are located within the zone to be reassigned; instantiating, by the computing resource receiving the zone to be reassigned, the identified objects; suppressing, by the computing resource with a zone to be reassigned, the identified objects; reassigning the zone to the computing resource receiving the zone.

It is further provided a computer program comprising instructions for performing the method.

It is further provided a computer readable storage medium having recorded thereon the computer program.

It is further provided a system comprising a processor coupled to a memory, the memory having recorded thereon the computer program.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
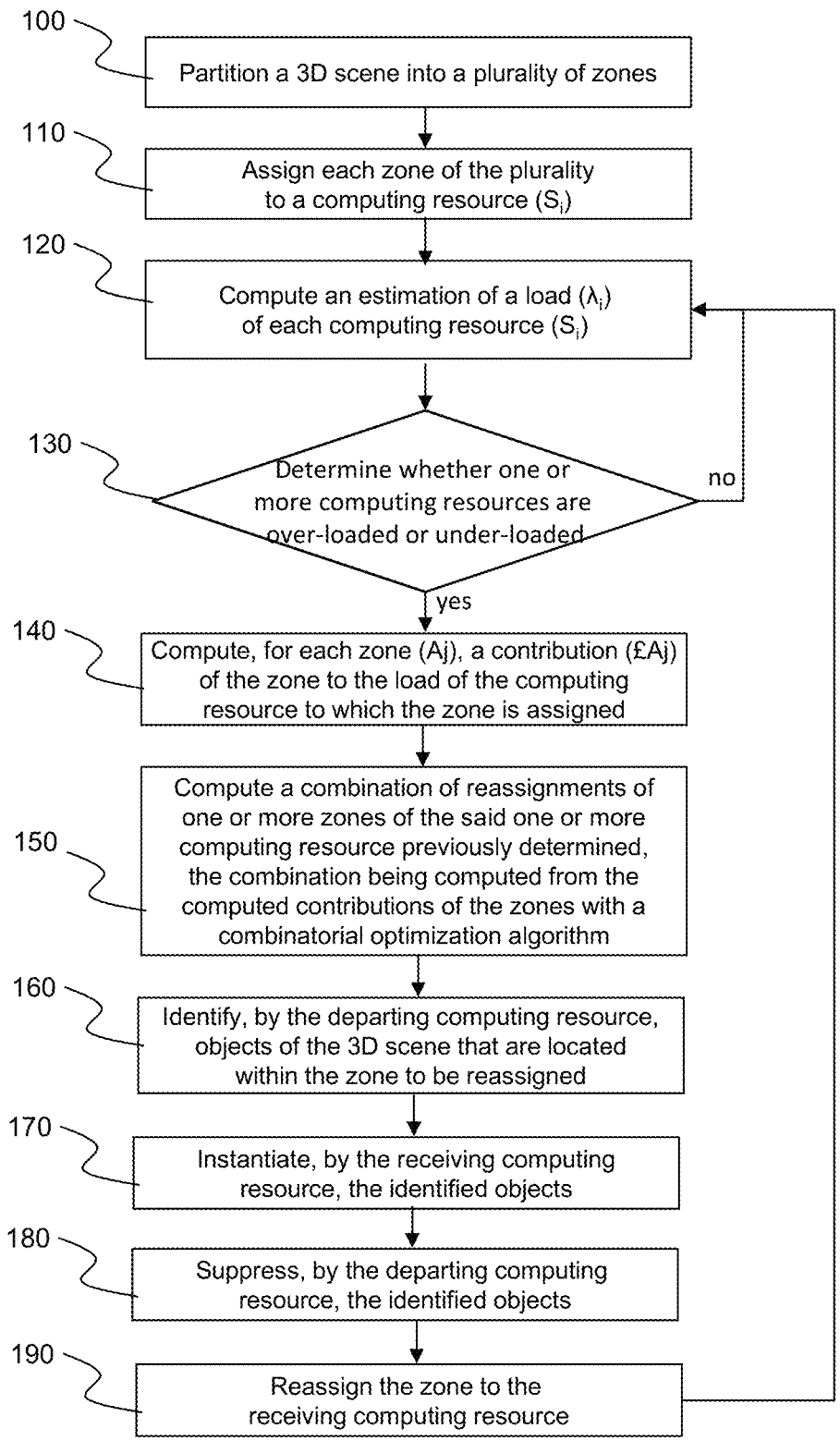
FIG. 1 shows a flowchart of an example of the method.

With reference to the flowchart of FIG. 1, it is proposed a computer-implemented method for simulating a 3D scene. The simulation is carried out with a set of computing resources running in parallel. The method comprises a partitioning of the 3D scene being simulated into a plurality of zones. The partitioning is performed such that each zone, noted $A_j$, satisfies real-time computing constraint(s) by one computing resource, noted $S_i$, of the set of computing resources. The method also comprises assigning each zone of the plurality to a computing resource; the computing resource is then in charge of performing the computation related to the zone. The method further comprises computing an estimation of a load, noted $\lambda_i$, of each computing resource. The method then comprises determining whether one or more computing resources are over-loaded or under-loaded. Over-loaded means that the amount of computations to perform during a time step of the simulation excesses the capacity of the computing resource. Under-loaded means that the amount of computations to perform during a time step of the simulation is well below the capacity of the computing resource. The method also comprises computing, for each zone, a contribution of the zone, noted $£A_j$, to the load of the computing resource to which the zone is assigned. The method further comprises reassigning one or more zones of a computing resource that is over-loaded or under-loaded to another computing resource. The computing resource that has been determined as being over-loaded or under-loaded is also referred to as departure computing resource. The computing resource toward which the one or more zones are reassigned is also referred to as receiving computing resource. The reassignment results from the computed contributions of the zones with a combinatorial optimization algorithm.

Such a method achieves a fair load balancing among an optimal number of solvers, running at their optimal capacity, avoiding overhead prone to corrupt real-time response of the simulation of the 3D scene. Notably, when used with solvers in multi-servers architecture, the method opens no-limit expansion of the 3D scene, as it makes possible the smooth transfer of a running 3D scene from a source physical architecture to bigger target architecture. The method is simple to implement and can be executed in an efficient way, while granting a feasible fair balance of the computing load among solvers. The fair balance is achieved by combining an inferred knowledge of the contribution for each zone to the load of the computing resource to which the zone is assigned with the use of a combinatorial optimization algorithm to find an optimal solution for the reassignment of one or more zones with an optimal time frame.

The method is computer-implemented. This means that the steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

For instance, the step of partitioning the 3D scene might be carried out by a user, e.g. by use of a dedicated tool. Another example, the reassignment of one or more zone to another computing resource might be performed in accordance with user's constraint(s), e.g. the user can decide that a given resource must keep overloaded or under loaded. A further example, a step of providing a 3D scene to be simulated may precede the partitioning step and be performed upon user selection; the user may carry out the selection via a haptic device such as a keyboard, a mouse, a stylus, or the like. For instance, in a two-button mouse, the left button could be used for selecting the scene in a list of scenes. The system may also identify by default a scene, i.e. without requiring user selection.

A typical example of computer-implementation of the method is to perform the method with a system adapted for this purpose. The system comprises a processor coupled to a memory, the memory having recorded thereon a computer program comprising instructions for performing the method. The memory may also store a database. The memory is any hardware adapted for such storage, possibly comprising several physical distinct parts (e.g. one for the program, and possibly one for the database). Such a system achieves a fair load balancing among an optimal number of solvers, running at their optimal capacity, avoiding overhead prone to corrupt real-time response of the simulation of the 3D scene. The system may further comprise a graphical user interface (GUI) suitable for displaying the 3D scene and objects within the 3D scene. The GUI is displayed on a display device that is coupled with the memory and the processor.

By "database", it is meant any collection of data (i.e. information) organized for search and retrieval. When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

In the case of the method, the database comprises the 3D scene, one or more objects of the 3D scene, and information related to the plurality of zones. The one or more objects are stored on the database, and may be stored independently from the scene. The database may further comprise a computer program comprising instructions for execution by the system. The instructions are adapted for performing the steps of the present method.

The method generally manipulates modeled objects that are in the 3D scene. A modeled object is any object defined by data stored e.g. in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. The system may be also MMO or MMOG system wherein a 3D scene and/or 3D modeled objects are simulated.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of the invention, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The simulated 3D scene and the 3D modeled object in the 3D scene may represent the geometry of a product to be manufactured in the real world subsequent to the completion of its virtual design with for instance a CAD software solution or CAD system, such as a (e.g. mechanical) part or assembly of parts (or equivalently an assembly of parts, as the assembly of parts may be seen as a part itself from the point of view of the method, or the method may be applied independently to each part of the assembly), or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object designed by the method may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

A CAD system may be history-based. In this case, a modeled object is further defined by data comprising a history of geometrical features. A modeled object may indeed be designed by a physical person (i.e. the designer/user) using standard modeling features (e.g. extrude, revolute, cut, and/or round) and/or standard surfacing features (e.g. sweep, blend, loft, fill, deform, and/or smoothing). Many CAD systems supporting such modeling functions are history-based system. This means that the creation history of design features is typically saved through an acyclic data flow linking the said geometrical features together through input and output links. The history based modeling paradigm is well known since the beginning of the 80's. A modeled object is described by two persistent data representations: history and B-rep (i.e. boundary representation). The B-rep is the result of the computations defined in the history. The shape of the part displayed on the screen of the computer when the modeled object is represented is (e.g. a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent.

By PLM system, it is additionally meant any system adapted for the management of a modeled object representing a physical manufactured product (or product to be manufactured). In a PLM system, a modeled object is thus defined by data suitable for the manufacturing of a physical object. These may typically be dimension values and/or tolerance values. For a correct manufacturing of an object, it is indeed better to have such values.

By CAM solution, it is additionally meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systèmes under the trademark DELMIA®.

By CAE solution, it is additionally meant any solution, software of hardware, adapted for the analysis of the physical behavior of modeled object. A well-known and widely used CAE technique is the Finite Element Method (FEM) which typically involves a division of a modeled objet into elements which physical behaviors can be computed and simulated through equations. Such CAE solutions are provided by Dassault Systèmes under the trademark SIMULIA®. Another growing CAE technique involves the modeling and analysis of complex systems composed a plurality of components from different fields of physics without CAD geometry data. CAE solutions allow the simulation and thus the optimization, the improvement and the validation of products to manufacture. Such CAE solutions are provided by Dassault Systèmes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systèmes under the trademark ENOVIA®.

Figure 7:
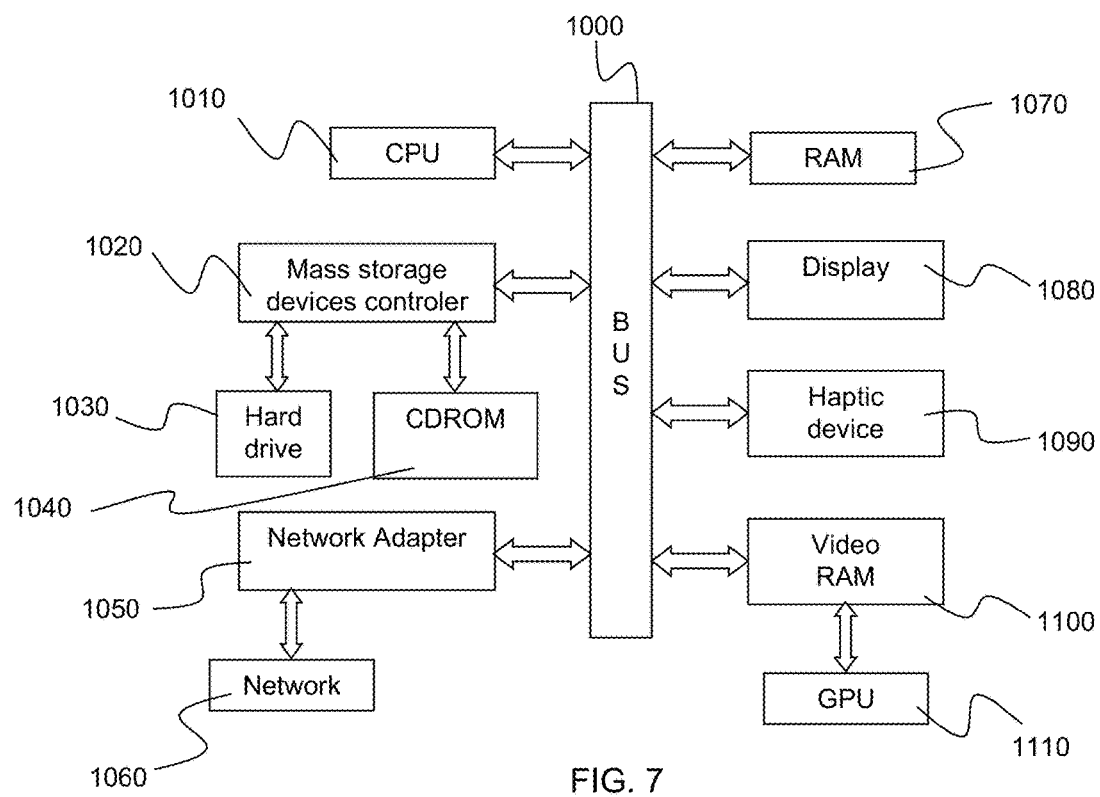
FIG. 7 shows an example of the system.

FIG. 7 shows an example of the system, wherein the system is a client computer system, e.g. a workstation of a user. The system may be a server, e.g. the server comprises the database. One or more of the steps may be performed by a client computer connected to a server that performs the remaining step of the method. The client and the computer may be connected through a computer network, e.g. the Internet, a WAN, LAN, and so on.

The client computer of the example of FIG. 7 comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

"Simulating a 3D scene" designates the process of running a model. The model imitates the operation of a real-world system over time. For instance, the 3D scene comprises 3D modeled objects, and each 3D modeled object reproduces (one can also say model) a piece of the system modeled by the 3D scene. The 3D modeled objects may represent the geometry of a product to be manufactured in the real world subsequent to the completion of its virtual design with for instance a CAD software solution or CAD system and to the completion of its simulation with for instance a MMO application.

The method may be included in a manufacturing process, which may comprise, after creating the 3D scene, simulating the 3D scene. The simulated 3D scene may be then produced, that is, a physical product corresponding to the modeled system is produced. In any case, the 3D scene simulated by the method may represent a manufacturing object. Because the method improves the simulation of a 3D scene, the method also improves the manufacturing of a product and thus increases productivity of the manufacturing process.

Referring now to FIG. 1, at step 100, a 3D scene is partitioned into a plurality of zones. The step 100 takes place prior to running simulation. Each zone, noted $A_j$, is sized to satisfy real-time constraint(s) computing by one computing resource, noted $S_i$, of a set of computing resources running in parallel. One understands that the 3D scene has been provided before the step 100 is carried out, e.g. the 3D scene is available to the system that performs the method.

A zone is also referred to as Atomic Parts, and the step 100 may be called Atomic partitioning. The purpose of step 100 is to decompose the whole 3D scene into Atomic Parts. Each Atomic Part can run on a solver in real-time in any circumstances. The term "real-time" means that it provided a guarantee response within strict time constraints. Quantitatively, this means than simulating such a zone on a computing resource should take no more than 100% of the computing resource it is running on. Said otherwise, the amount of computation for simulating the zone during a time step of the simulation of the 3D scene does not excess the capacity of the computing resource: the computing resource has in any situation and at any time enough resources for simulating the zone.

A solver is a piece of code that can be executed by the computer program that simulates the 3D scene. The set of solvers thus simulate the complete 3D scene. It is assumed that each solver runs on its own dedicated computing resource that can range, but is not limited to, from a solving thread on a multi-core CPU, a process on a multi-CPU computer, to a server process on a server CPU. And so, the views "solver" and "computing resource" are strictly equivalent in term of load and performance. The expression "computing resource" is therefore synonym of the term "solver".

In practice, the computing resources are identical, that is, the time to simulate a given zone is the same on each computing resource of the set of computing resources running in parallel. This facilitates the fair load-balancing of the present invention as the reassignment of a zone to another computing resource does not need to take into account of the capacity of the computing resources. This also facilitates physical extension with additional and identical computing resources. Note that, otherwise, when computing resources have different capacity, it is possible to rely on a normalized common capacity with a set of appropriate weight factor associated to each computing resource.

Different solutions may be contemplated to determine the zones that conform to this real-time requirement. For instance, a basic empirical solution consists of an iterative process of tests and tries, where geometry of each zone (that is, its size) is manually adjusted, and then each zone is simulated individually on a solver, checking than the CPU is always below 100%. For such individual situation, it is necessary to contemplate the most critical situation possible, with as many objects as possible, and as many interactions as possible to set a capacity limit, which will never be crossed. Another solution consists in using the partitioning method of a 3D scene described in the document EP12306654.0 filed on 2012 Dec. 21 and published on 2014 Jun. 25 under publication number EP2745892 (A1). It is to be understood that any other suitable method for partitioning the 3D scene can be used if it allows creating zones that respect the real-time requirement.

Having determined N zone of the 3D scene, it is granted that the 3D scene will always meet real-time requirement when running on N computing resources. However, as the zones have been designed so that they can resists the most critical situations and as such critical situation is unlikely to occur, less than N computing resources are sufficient most of the time.

A 3D scene is a space in which spatial relationships between objects are described. The scene is comprised of at least two objects, and the objects may be, but not limited to, modeled objects or 3D modeled objects. A 3D modeled object is a description of an object in a 3D space. A 3D scene is a model of a physical universe, which may be mathematically represented by a geometry which describes every point in 3D space by means of coordinates. The 3D scene is typically a real-world simulated wherein realistic interactions between the objects are simulated. The expression realistic interactions means that the simulated interactions reflects the interactions of the real-world, e.g. physical laws such that forces/efforts (gravity, magnetism, contact), control laws such that information flow, control events. . . . The one or more objects evolve in the 3D scene and are subject to the laws of the simulated real-world, e.g. two objects cannot intersect each other. The 3D scene comprises a layout that can be modified for the purpose of specific scenarios. A scenario describes at least foreseeable interactions of the one or more objects in the 3D scene. The scenario thus describes one way that the 3D scene is or is envisaged to be used in the context of an activity. Each specific scenario will be simulated on the layout. It is to be understood that the scenario may be defined by the user.

A zone of the 3D scene may be a 2D plane on which objects of the 3D scene may be located. The zone is thus a 2D zone with a size that is an area. For instance, the layout of the scene can be divided into zones. In this case, the objects that are on or over the 2D zone belong to the zone: this means that the simulation of the zone includes the simulation of the objects of the zones. A zone can be a volume of the 3D scene. The 3D scene is divided into N 3D volumes. In this case, the objects that are located within a volume belong to the volume. Preferably, the volume are determined so that an object does not interact the volume; if it does, it is arbitrary determined to which volume the object belongs to.

Preferably, zones have a regular geometry that makes easier the partitioning of the 3D scene. For instance, the 3D zone may be cubes. The zone is thus a 3D zone with a size that is a volume. The partitioned 3D scene may be comprised of a combination of 2D zones and 3D zones. The 3D scene has boundary and is not infinite; the number N of zones is thus a finite number.

Figure 3:
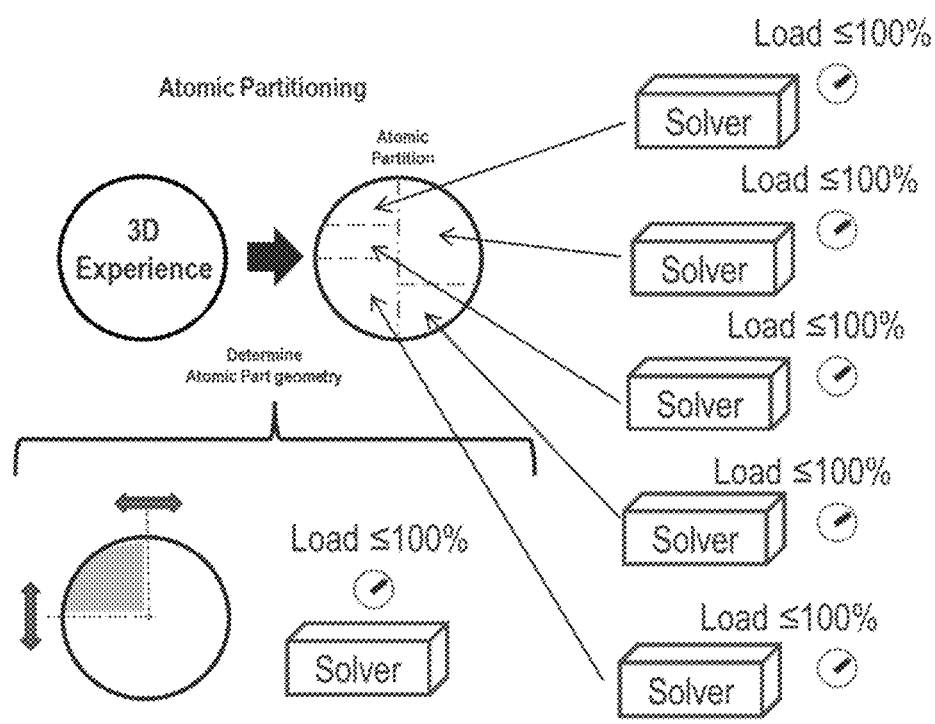

FIG. 3 illustrates an example of atomic partitioning of the 3D scene into zones. Here the "3D experience" (which is a synonymous of the expression "3D scene") is divided into N 2D zones, and each zone is associated with one of the N computing resources. The load on each computing resource is equal or less than 100% of the maximum computing load the computing resource can support.

The term load means a measure of the amount of computational work that a computing resource performs. The measure of the load can be the time consumed for executing a task in view of the available time for executing the said task.

Figure 2:
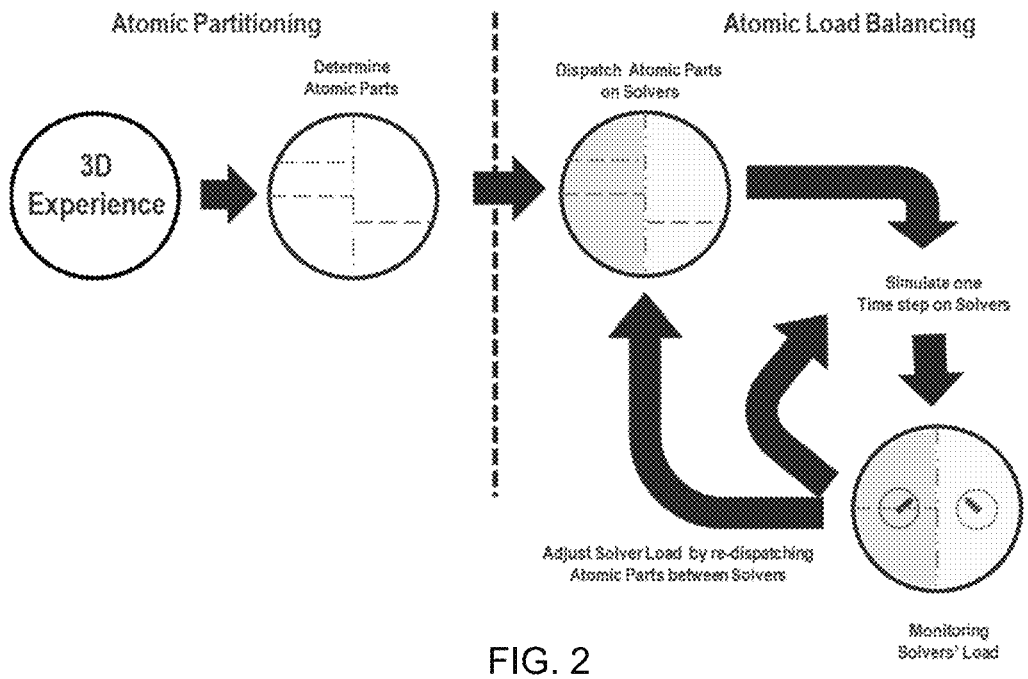
FIGS. 2, 3, 4, 5, and 6 show an example of the method.

Steps 110 to 190 are now executed. These steps can be referred to as Atomic Load Balancing, which takes place while running simulation on solvers, where solvers' load is monitored after each simulation time-step, and where Atomic Parts occasionally re-dispatched among solvers to adjust their load. While the step 100 belongs to the built-time of the simulation, the steps 110 to 190 belongs to the run-time of the simulation. FIG. 2 illustrates the relation between the built-time (or Atomic Partitioning) and the run-time (or Atomic load balancing): once the built-time has been carried out, the run-time is triggered.

Each zone is assigned to a computing resource, at step 110. Preferably, one zone is assigned to one computing resource. This is performed as known in the art and managed by the simulator that is a computer program performing the run-time and/or the built-time. As a result of step 110, each Atomic part has been dispatched on a solver.

Then, the steps 120 to 190 are carried out. One of the objective of these steps is to select the appropriate number M of computing resources among the N available (as determined by the zones obtained with the partitioning), sufficient to run the 3D scene.

Those M solvers $S_i$ must run with a fair load assignment, i.e. their loads $\lambda_i$ must be close but less than 100%; while N-M solvers $S_j$ are inactive, with a load $\lambda_j$ equal to 0%. However, to absorb the possible sudden variations in load, a safety range can be set and the practical condition for fair balance can be expressed as by the relation (1)

$$\lambda_{min} \leq \lambda_i' \leq \lambda_{max} < 100\% \tag{1}$$

wherein $\lambda_{min}$ is the minimum load that a computing resource has to support, $\lambda_{max}$ is the maximum load that a computing resource has to support.

The steps 120 to 190 aims at providing the following two function. The first one is the detection of ill-balance situations, by periodically monitoring solver loads and by checking whether condition for fair balance (1) is no longer verified. The second one is adjusting zone distribution among solvers, if ill-balance situation is detected, so that solver loads return back to fair balance with condition of relation (1) verified.

The steps 120 to 130 aim at performing the detection of ill-balance situations.

At step 120, an estimation of a load ($\lambda_i$) of each computing resource ($S_i$) is computed. Only an estimate can be computed as it is not possible to directly measure load on a computing resource, that is, on a solver. The estimation of the load $\lambda_i$ of the computing resource can be compute from the elapsed time $T_i$ spend by the computing resource $S_i$ to compute a time step of simulation.

$T_i$ measure can be instrumented as follow: computing resource $S_i$ software code calls the CPU system function to get a start time-stamp, just before it starts its solving cycle, and calls again the CPU system to get an end time-stamp, just when it terminates. The elapsed time $T_i$ is the difference between these 2 time-stamps.

Elapsed time $T_i$ and can be considered as proportional to load $\lambda_i$ of computing resource $S_i$, reminding that each computing resource runs on its own computing resource and assuming that a solving cycle is computed in one shot without interruption.

A maximum duration $T_{max}$ can be fixed for a computing resource $S_i$ to compute within simulation step: above this maximum duration $T_{max}$, the computing resource $S_i$ does not meet its real-time requirement anymore.

The choice of the maximum duration $T_{max}$ mainly depends on the model that is simulated, and more generally, on the type of application that needs a simulation. For instance for a video game in an MMOG, the scene has to be refreshed every $\frac{1}{50}$ second (s) for a fluid animation. So each computing resource should return the result of its computation in a time period that does not exceed $\frac{1}{50}$ s. As another example for rigid multi-body dynamics simulated in a MMO application, this maximum duration $T_{max}$ is smaller than in the video game case, and will depend on the inertial properties of the objects and the dictated numerical precision of results.

Thus, with the convention that $T_{max}$ corresponds to 100% of the load capacity of the computing resource $S_i$, the estimation of the load $\lambda_i$ of a computing resource, expressed as a percentage and noted $\lambda_i$ (%), for a given time step of the simulation, can be deducted from the elapsed time $T_i$ of the computing resource by the relation or formula (2)

$$\lambda i(\%)=100(T\mathrm{max}-Ti)/T\mathrm{max} \qquad (2)$$

Figure 4:
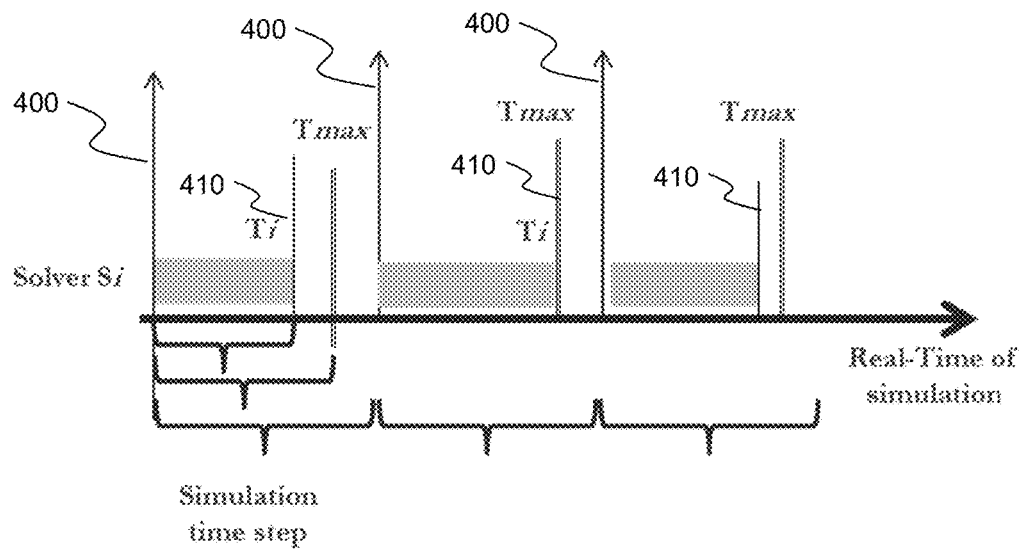

For the sake of explanation, FIG. 4 illustrates an example of timeline of a simulation. In this example, three simulation time steps are shown, each starting at a point in time 400. For the first and third simulation time steps, the solver has finished computation before $T_{max}$ elapsed, and for the second one, at the time $T_{max}$ elapsed. The end of the computation is represented by the line 410.

Interestingly, the time period that elapses between $T_{max}$ and the next simulation time step gives time to the simulator to reassign one or more zones. This time period is also used by the simulator for collecting the results of the simulation, and rendering the results of the simulation. Hence, $T_{max}$ may be further chosen in order to ensure a correct functioning of the simulator.

Then, at step 130, one determines whether one or more computing resources are over-loaded or under-loaded. This determination is performed for each computing resource according to its estimation of a load $\lambda_i$ computed at the step 120.

Hence, when $\lambda_{max} \leq \lambda_i$, the computing resource $S_i$ is critically nearing its capacity limit for real-time and it is necessary to transfer part of its load to another solver; the computing resource is considered as being over-loaded. And when $\lambda_i < \lambda_{min}$, the computing resource $S_i$ is under employed, and possibly it can be de-activated by transferring its content to one or more other active solvers. The computing resource is under-loaded. One understands that this situation is not a critical situation, which can possibly continue as is, without jeopardizing real-time performances of the simulation.

When no computing resources has been determined over-loaded or under-loaded, the step 120 is repeated. The repetition of the steps of 120 and 130 may be performed for each $P^{th}$ time step of the simulation, wherein P is a natural number. Regarding the value of P, it mainly depends on the type of simulation being simulated. For example, with Multi-rigid Body Dynamics, setting empirically P around 8 gives good results, for classical scenarios. Hence, P preferably belongs to the range 6 to 8, bound included, when Multi-rigid Body Dynamics are involved in the simulation. More generally, the selection of a good value of P is related to the bandwidth of modeled phenomena (e.g. collision precision, maximum velocity, appearance rate of objects, etc. . . . ). It is also possible to determine P thanks to classical identification methods providing numerical relationship load time derivative versus specific scene characteristics time derivatives.

Repeating the steps 120 and 130 for each time step of the simulation ensures that the appropriate number M of solvers among the available N is optimal. However, performing these steps 120 and 130 at each time step of the simulation has a cost in term of CPU and memory uses for the computer system that performs the simulation. Reducing the number of executions of these steps 120 and 130 decreases this cost, but it can lead to a situation in which the number M is no more appropriate, thus compromising the simulation.

When one or more computing resource have been determined over-loaded or under-loaded, the repetition of the steps of 120 and 130 is temporarily stopped and will start again once the reassignment has been computed and carried out.

At step 140, for each zone $A_j$, one computes a contribution $\pounds A_j$ of the zone to the load of the computing resource to which the zone is assigned. The contribution $\pounds A_j$ of a zone $A_j$ evaluates the individual contribution of the zone to the load of the computing resource to which the zone is assigned.

The current load $\lambda_i$ of a solver $S_i$ running a number Q of zones $A_j$ is the sum of the individual contributions of the Q zones. The relationship (3) between individual contribution $\pounds A_j$ of a zone $A_j$ is assumed and given weight factor $\mu_j$ so that:

$$\pounds A_j = \mu_j \cdot \lambda_i \qquad (3)$$

$\pounds A_j$ is thus the product between $A_j$ and $\mu_j$. The weight factor has a value that belongs to the range [0; 1].

Weight factor $\mu_j$ can be estimated in many ways. It can be proportional to surfaces of the 2D zones managed by the computing resource $S_i$. It can be proportional to the volumes of the 3D zones managed by the computing resource $S_i$. It can be proportional to population of dynamic objects within the zones managed by the computing resources. A dynamic objects is an object that can potentially move in the 3D scene. A dynamic object is thus opposed to static object that never moves in the 3D scene and that cannot be traversed by another object. The 3D scene may thus be contemplated as comprising a layout of static objects and a set of dynamic object moving/evolving in said layout. The weight factor can also be based on an analytical model of solver performance, or based on quantitative characteristics of the simulation model it computes.

The weight factor of each zone of a computing resource thus represents the preponderance of the zone among the other zones that are assigned to the computing resource. Therefore, the sum of the weight factors $\mu_j$ of the zones assigned to a computing resource is equal to 1.

Figure 5:
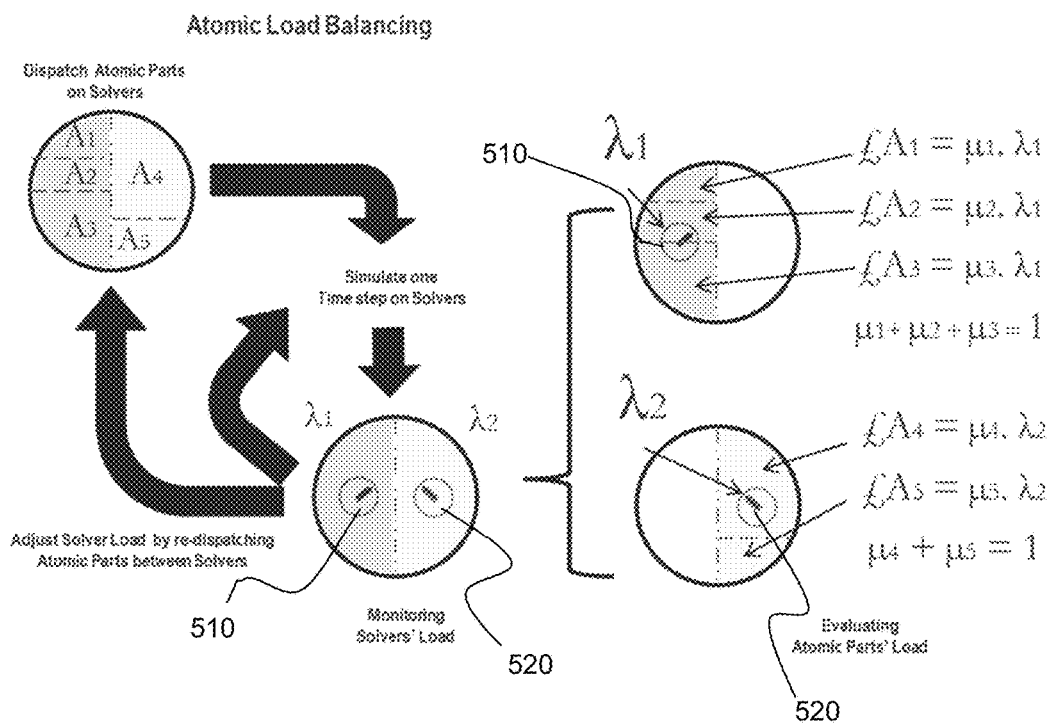
Figure 6:
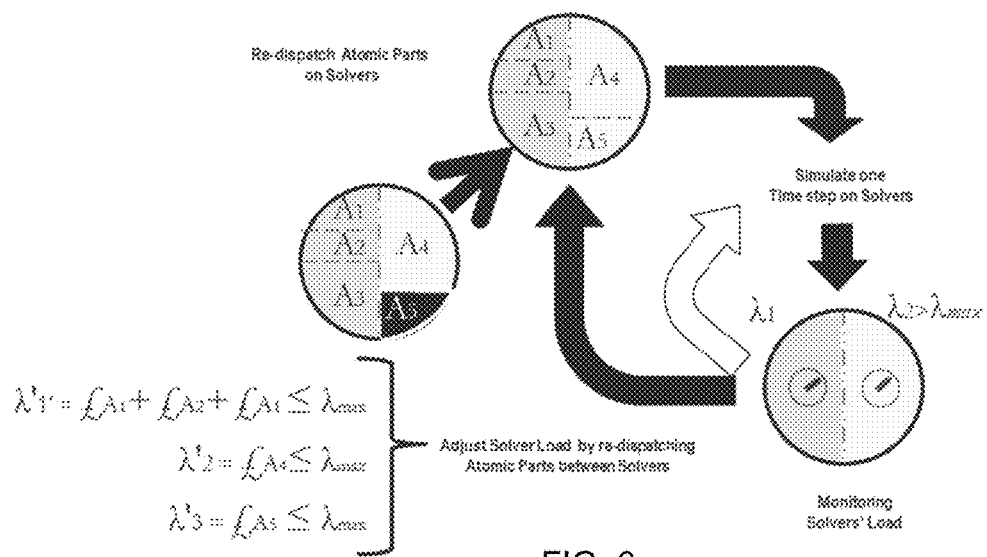

FIG. 5 illustrates an example of the step 140. Zones A1, A2 and A3 have been dispatched to the solver $S_1$ and the zones A4 and A5 have been dispatched to the solver $S_2$. After the execution of one simulation time step on both solvers $S_1$ and $S_2$, the load on the solvers has been monitored, that is, the steps 120 and 130 have been carried out. As at least one of the solvers $S_i$ has been determined over-loaded or under-loaded, the step S140 is carried out: the contributions of the zones A1, A2 and A3 to the load $\lambda_1$ on the solver $S_1$ and the contributions of the zones A4 and A5 to the load $\lambda_2$ on the solver $S_2$ are computed, as illustrated on the right of FIG. 5.

In the example of FIG. 5, each solver $S_1$ and $S_2$ is in charge of the simulation of an object 510, 520. The object 510 is over the zone $A_2$ and the object 520 over the zone $A_4$. Thus the zones $A_2$ and $A_4$ have a weight factor (respectively $\mu_2$ and $\mu_4$) that is larger than the weight factors of the other zones.

At step 150, having thus estimations of current load of computing resources $\lambda_i$ and current load $\pounds A_j$ of the zones running on them, load balancing consists of moving one or more zones $A_j$ from a solver to another. The reassignment of one or more zones of a computing resource that is overloaded or under-loaded to another computing resource is carried out from the computed contributions of the zones with a combinatorial optimization algorithm. The combinatorial optimization aims at finding an optimal reassignment among all the combination of reassignments that can be obtained when considering the estimation of the current load $\lambda_i$ and the current loads $£A_j$. That is, the algorithm computes all the combinations of zones that are possible according to the contributions $£A_j$ of the zones and the estimation of the load $\lambda_i$ of the zones. There are N! ways to dispatch the N zones among the N computing resources or, in other words, to select one among the N computing resources for each of the N zones.

For determining what the best solution among the combinations is and for limiting the number of combinations to compute, the algorithm may take as one or more criterion representing objectives to be reached. An objective function can be used to determine the best solution according to one or more criteria. At least one criterion is selected among the following criteria:

the number of computing resources that actively compute the simulation in parallel is minimal. This allows limiting the number of under-loaded computing resources;

the number of zones reassigned to another computing resource is minimal. This allows limiting the CPU/memory use of the system performing the simulation, and it also makes easier for the simulator the management of load balancing as less zones are involved in the reassignment;

the one or more zones are reassigned to another computing resource that already performs computation for one or more of the zones that are neighbor of the reassigned one or more zones. This is useful for the simulation of 3D scene with many object displacements from a zone to another one. The simulation is more easily managed.

Preferably, the reassignment of one or more zones to another computing resource is carried out such that a resulting load ($\lambda_1'$) of each computing resource verifies the relation (1)

$$\lambda_{min} \leq \lambda_i' \leq \lambda_{max} < 100\% \qquad (1)$$

Up to N=10, it is still possible to evaluate the 3 objectives extensively for all the 3.328.300 combinations in a short amount of time and then select the one best solution. However, much scalable technique may be used; for instance, a combinatorial optimization algorithm such as Ant Colony Algorithm can be used to find an optimal solution within a reasonable time frame. It is to be understood that any other suitable combinatorial optimization algorithm can be used.

From now, a combination of reassignment has been selected among the set of combinations. The reassignment is now carried out at step 160 to 190.

At step 160, the computing resource that manages a zone to be reassigned identifies the objects of the 3D scene that are located within the zone to be reassigned. This computing resource is also referred to as departing computing resource, and the reassigned zone is called departing zone.

Then, at step 170, the computing resource that receives the departing zone instantiates the objects identified at step 160. The computing resource that receives the departing zone is also called destination computing resource. Two instances of the objects are computed, one on the departing zone and one on the destination zone, but only the instances of the departing computing resource are running in the simulation.

Next, at step 180, the departing computing resource suppresses its instances of the identified objects.

And then, at step 190, the destination zones receives the zone, that is, the instances of the objects are running in the simulation as well as the zone reassigned.

The steps 120 to 190 can be repeated until the simulation is running.

The rendering and/or the display of the simulation may be performed on the system that performs the simulation. Alternatively, the rendering and/or the display of the simulation display may be performed on another system, e.g. on a client computer connected to the server that performs the simulation.

The invention claimed is:

1. A computer-implemented method for simulating a 3D scene, the simulation being carried out with a set of computing resources, implemented by processing circuitry, running in parallel, comprising:

partitioning, by the processing circuity, a 3D scene into a plurality of zones, each zone being sized to satisfy real-time computing constraint by one computing resource of the set;

assigning, by the processing circuity, each zone of the plurality to a computing resource;

computing, by the processing circuity, an estimation of a load of each computing resource ($S_i$) and determining whether one or more computing resources are overloaded or under-loaded;

computing, for each zone and by the processing circuitry a contribution of the zone to the load of the computing resource to which the zone is assigned; and reassigning, by the processing circuity, one or more zones of a computing resource that is over-loaded or under-loaded to another computing resource, the reassignment resulting from the computed contributions of the zones with a combinatorial optimization algorithm.

2. The computer-implemented method of claim 1, wherein the reassignment of one or more zones to another computing resource is carried out according to one or more of the following criterions:

the number of computing resources is minimal;

the number of zones reassigned to another computing resource is minimal; and the one or more zones are reassigned to another computing resource that already perfonns computation for a zone that is neighbor of the reassigned one or more zones.

3. The computer-implemented method of claim 1, wherein the reassignment of one or more zones to another computing resource is carried out such that a resulting load of each computing resource verifies $$\lambda_{min} \leq \lambda_i' \leq \lambda_{max}$$

wherein $\lambda_{min}$ is the minimum load of a computing resource, $\lambda_{max}$ is the maximum load of a computing resource.

4. The computer-implemented method of claim 1, wherein the estimation of the load ($\lambda_i$) of each computing resource is computed with the relation $\lambda_i$ (%)=100·($T_{max}$−$T_i$)/$T_{max}$ wherein $\lambda_i$ (%) is a percentage of the estimated load $\lambda_i$, $T_{max}$ is the maximum time allocated to a computing resource for computing a time step of the simulation, $T_i$ is the elapsed time used by a computing resource for computing a time step of the simulation.

5. The computer-implemented method of claim 1, wherein the contribution of a zone is computed with the formula $£A_i = \mu_i \cdot \lambda_i$ wherein $\mu_i$ is a weight factor with a value that belongs to a range [0; 1].

6. The computer-implemented method of claim 5, wherein the weight factor $\mu_i$ is estimated from one or more selected among:

a surface or a volume of a zone;

a number of dynamic objects of a zone;

an analytical model of the computer resource of load $\lambda_i$.

7. The computer-implemented method of claim 1, wherein one or more zones of the plurality of zones is a 2D zone, wherein a 2D zone is 2D surface in the 3D scene.

8. The computer-implemented method of claim 1, wherein one or more zones of the plurality of zones is a 3D zone, wherein a 3D zone is 3D volume of the 3D scene.

9. The computer-implemented method of claim 1, wherein the steps of computing the estimation of the load and determining whether one or more computing resources are over-loaded or under-loaded are performed each P time step of the simulation, wherein P is a natural number.

10. The computer-implemented method of claim 9, wherein the contribution of a zone is computed after that one or more computing resources have been determined as over-loaded or under-loaded.

11. The computer-implemented method of claim 1, wherein all the computing resources are identical.

12. The computer-implemented method of claim 1, wherein reassigning one or more zones of a computing resource that is over-loaded or under-loaded to another computing resource further comprises:

identifying, by the computing resource with a zone to be reassigned, objects of the 3D scene that are located within the zone to be reassigned;

instantiating, by the computing resource receiving the zone to be reassigned, the identified objects;

suppressing, by the computing resource with a zone to be reassigned, the identified objects;

reassigning the zone to the computing resource receiving the zone.

13. A non-transitory computer readable storage medium having recorded thereon a computer program that when executed by a computer causes the computer to execute the method of claim 1.

14. A system for simulating a 3D scene, the simulation being carried out with a set of computing resources running in parallel, comprising:

processing circuitry coupled to a memory, the memory having recorded thereon the computer program that when executed causes the processing circuitry to be configured to partition a 3D scene into a plurality of zones, each zone being sized to satisfy real-time computing constraint by one computing resource of the set, assign each zone of the plurality to a computing resource, compute an estimation of a load of each computing resource and determine whether one or more computing resources are over-loaded or under-loaded, compute, for each zone, a contribution of the zone to the load of the computing resource to which the zone is assigned, and reassign one or more zones of a computing resource that is over-loaded or under-loaded to another computing resource, the reassignment resulting from the computed contributions of the zones with a combinatorial optimization algorithm.

\* \* \* \* \*